United States Patent
Safrani et al.

(10) Patent No.: US 11,774,866 B2
(45) Date of Patent: Oct. 3, 2023

(54) ACTIVE RETICLE CARRIER FOR IN SITU STAGE CORRECTION

(71) Applicant: KLA Corporation, Milpitas, CA (US)

(72) Inventors: Avner Safrani, D.N. Misgav (IL); Adi Pahima, Migdal-Hahemek (IL); Ron Rudoi, Haifa (IL); Shai Mark, Kibutz Snir (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/446,035

(22) Filed: Aug. 26, 2021

(65) Prior Publication Data

US 2022/0066333 A1    Mar. 3, 2022

Related U.S. Application Data

(60) Provisional application No. 63/073,937, filed on Sep. 3, 2020.

(51) Int. Cl.
*G03F 7/20* (2006.01)
*G03F 7/00* (2006.01)

(52) U.S. Cl.
CPC ...... *G03F 7/70825* (2013.01); *G03F 7/70516* (2013.01); *G03F 7/70591* (2013.01)

(58) Field of Classification Search
CPC ............ G03F 7/70825; G03F 7/70516; G03F 7/70591; G03F 7/70741; G03F 1/84
USPC ........................................................ 414/355
See application file for complete search history.

(56) References Cited

U.S. PATENT DOCUMENTS

| | | | |
|---|---|---|---|
| 5,608,773 A * | 3/1997 | Korenaga | G03F 7/707 378/208 |
| 6,590,633 B1 * | 7/2003 | Nishi | G03F 7/70991 269/21 |
| 9,851,643 B2 | 12/2017 | Chilese et al. | |
| 2012/0037819 A1 | 2/2012 | Heumuller et al. | |
| 2013/0000254 A1 | 1/2013 | Rebstock | |
| 2013/0255407 A1 * | 10/2013 | Chilese | G03F 7/70741 414/225.01 |

FOREIGN PATENT DOCUMENTS

| | | |
|---|---|---|
| WO | 2018111227 A1 | 6/2018 |
| WO | 2019037672 A1 | 2/2019 |

OTHER PUBLICATIONS

WIPO, ISR for International Application No. PCT/US2021/048570, dated Dec. 21, 2021.

* cited by examiner

*Primary Examiner* — Mesfin T Asfaw
(74) *Attorney, Agent, or Firm* — HODGSON RUSS LLP

(57) ABSTRACT

A reticle inspection system and a method of handling a reticle in a reticle inspection system are provided. The reticle inspection system includes an active reticle carrier and an inspection tool. The reticle is disposed on the active reticle carrier, and the inspection tool is configured to determine an orientation of the reticle when the active reticle carrier is disposed on a reticle stage. The active reticle carrier is movable between a loading station and the reticle stage and is configured to rotate the reticle to reorient the reticle based on the orientation of the reticle while the active carrier is disposed on the reticle stage.

18 Claims, 7 Drawing Sheets

ACTIVE RETICLE CARRIER FOR IN SITU STAGE CORRECTION

CROSS-REFERENCE TO RELATED APPLICATIONS

This application claims priority to the provisional patent application filed Sep. 3, 2020 and assigned U.S. App. No. 63/073,937, the disclosure of which is hereby incorporated by reference.

FIELD OF THE DISCLOSURE

This disclosure relates to reticle inspection systems and, more particularly, to handling a reticle within a reticle inspection system.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer or EUV mask using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Lithographic processes utilizing electromagnetic energy in the form of extreme ultraviolet (EUV) light are being developed for selective exposure of the resist. EUV radiation generated by an EUV radiation source is directed to a reticle surface, reflected from the reticle surface, and projected onto a wafer in a clean vacuum environment. The reticle surface is patterned and the reflected light projects this pattern onto the wafer. To achieve ever smaller patterned feature sizes, the feature sizes of reticle patterns continue to shrink. Consequently, particle contamination requirements on the reticle surface continue to become more stringent.

In an effort to reduce particle contamination, a standard EUV pod (compliant with SEMI standard E152-0709) has been developed. An EUV pod includes an outer carrier, commonly referred to as a Reticle SMIF Pod (RSP), and an inner pod, commonly referred to as an EUV Inner Pod (EIP). The RSP is suitable for transporting EUV masks among different production stations and sites. The EIP is a protective enclosure that allows the reticle to remain within a protective environment until inside vacuum and near the reticle stage. During pumpdown to vacuum or vent to atmospheric pressure, particles can be stirred up and deposited onto a reticle surface. The EIP allows the reticle to remain within a protective environment until inside vacuum and near the stage. A number of publications describe the development of an EUV Inner Pod (EIP) to protect the reticle, including U.S. Pat. No. 9,851,643, the entirety of which is incorporated by reference herein.

Traditionally, the EIP is opened in vacuum to allow the reticle to be loaded onto an electrostatic chuck. The use of an electrostatic chuck is expensive and creates many particles that accumulate on the backside of the reticle. Alternatively, the reticle may be loaded directly onto the reticle stage using a clamp mechanism. This has a number of disadvantages. First, the clamping process generates a significant number of particles. In the clean vacuum environment required for EUV lithographic or inspection processing, control of these particles is difficult. Moreover, the generation of these particles in the processing environment is undesirable. Second, the EIP was developed specifically for use with a reticle stage with an electrostatic chuck. The limitations of the EIP design make it difficult to use in applications with a different method of holding the reticle, namely clamping. This complicates the stage design and also makes it difficult to control particles created during the clamping process.

When the reticle is loaded on to the reticle stage, alignment errors may be discovered by the inspection tool. To correct these errors, the reticle must be removed from the reticle stage, unclamped from the passive reticle carrier, returned to the reticle loading system to reorient the reticle, re-clamped to the passive reticle carrier, and returned to the reticle stage. These steps require multiple hand-offs of the reticle which reduce throughput and expose the reticle to particle contamination through multiple clamping steps. Furthermore, there is no way to measure the clamping force on the reticle, which can cause damage or affect the accuracy of the lithographic processes.

Therefore, what is needed is a reticle inspection system which can adjust the orientation of the reticle in situ, while the reticle is disposed on the reticle stage.

BRIEF SUMMARY OF THE DISCLOSURE

An embodiment of the present disclosure provides a reticle inspection system. The reticle inspection system may comprise an active reticle carrier. A reticle may be disposed on the active reticle carrier. The reticle inspection system may further comprise an inspection tool. The inspection tool may be configured to determine an orientation of the reticle when the active reticle carrier is disposed on a reticle stage. The active reticle carrier may be movable between a loading station and the reticle stage and may be configured to rotate the reticle to reorient the reticle based on the orientation of the reticle while the active carrier is disposed on the reticle stage.

According to embodiments of the present disclosure, the reticle may be clamped to the active reticle carrier. An electromagnetic actuator may be disposed on the active reticle carrier and configured to apply a clamping force on the reticle.

According to embodiments of the present disclosure, the active reticle carrier may comprise a carrier base, a rotation plate rotatably mounted to the carrier base, and a piezoelectric motor disposed in the carrier base. The piezoelectric motor may be configured to rotate the rotation plate relative to the carrier base.

According to embodiments of the present disclosure, the active reticle carrier may further comprise a rechargeable battery disposed on the carrier base and configured to power the piezoelectric motor. A transfer stage of the system may be configured to recharge the rechargeable battery when the active reticle carrier is disposed on the transfer stage.

According to embodiments of the present disclosure, the active reticle carrier may further comprise a processor disposed in the carrier base and in electronic communication with the inspection tool. The processor may be configured to receive orientation information corresponding to the orientation of the reticle and cause the rotation plate to rotate based on the orientation information.

According to embodiments of the present disclosure, the active reticle carrier may further comprise kinematic couplings protruding from a lower surface of the carrier base which engage with corresponding indentations in the reticle stage when the carrier base is disposed on the reticle stage.

According to embodiments of the present disclosure, the active reticle carrier may further comprise at least two reticle posts protruding upwardly from the rotation plate. The reticle may be disposed on the at least two reticle posts such that the reticle is spaced apart from the rotation plate.

According to embodiments of the present disclosure, the carrier base may comprise a first flange extending outwardly from a side wall of the carrier base. The rotation plate may comprise a second flange extending downward and inward from a bottom surface of the rotation plate. The rotation plate may be rotatably mounted to the carrier base such that the first flange is positioned between the second flange and the bottom surface of the rotation plate.

According to embodiments of the present disclosure, the reticle may be disposed in an EUV inner pod (EIP) which is opened by separating an EIP base from an EIP cover of the EIP before the reticle is placed on the active reticle carrier.

An embodiment of the present disclosure provides a method of handling a reticle in a reticle inspection system. The method may comprise placing the reticle on an active reticle carrier disposed on a loading station. The method may further comprise locating the active reticle carrier from the loading station onto a reticle stage. The method may further comprise determining, by an inspection tool, an orientation of the reticle. The method may further comprise rotating the reticle using the active reticle carrier to reorient the reticle based on the orientation of the reticle while the active reticle carrier is disposed on the reticle stage.

According to embodiments of the present disclosure, the method may further comprise clamping the reticle to the active reticle carrier. The method may further comprise determining a clamping force applied by an electromagnetic actuator on the reticle. The electromagnetic actuator may be disposed on the active reticle carrier. The method ma further comprise transmitting the clamping force on the reticle to the inspection tool.

According to embodiments of the present disclosure, locating the active reticle carrier from the loading station onto the reticle stage may comprise disposing the carrier base onto the reticle stage, such that kinematic couplings protruding from a lower surface of the carrier base engage with corresponding indentations on the reticle stage.

According to embodiments of the present disclosure, the reticle may be disposed in an EUV inner pod (EIP). Before placing the reticle on the active reticle carrier, the method may further comprises opening the EIP by separating an EIP base from an EIP cover of the EIP.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1A:
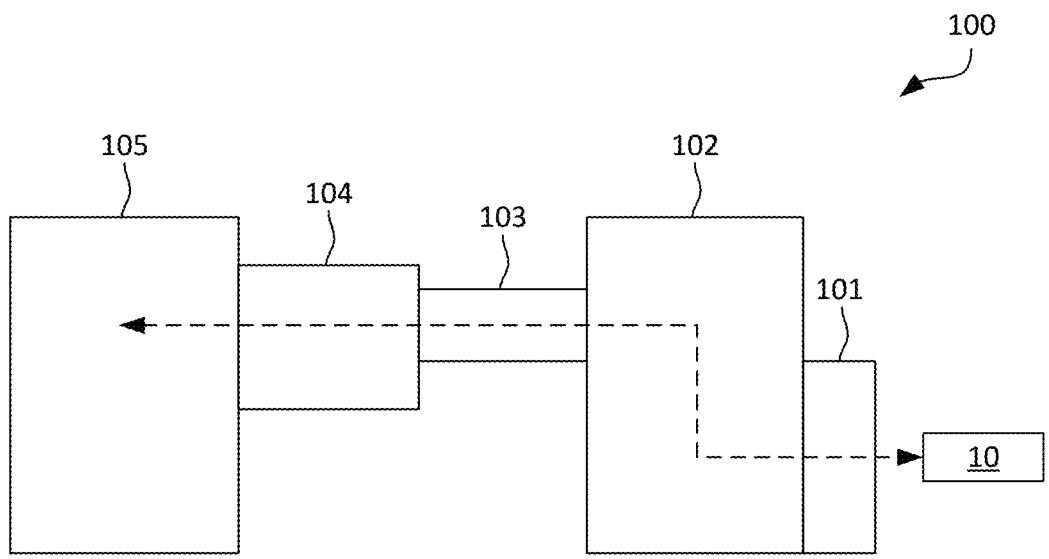
FIG. 1A is a schematic illustration of a reticle inspection system according to an embodiment of the present disclosure.

An embodiment of the present disclosure provides a reticle inspection system 100. As shown in FIG. 1A, the system 100 may include a pod loading system 101, a reticle loading system 102, a load lock 103, a transfer chamber 104, and a reticle inspection chamber 105. The dashed line generally illustrates the movement of a reticle 150 through the system 100 from entry at the pod loading system 101 to the reticle inspection chamber 105, and back out again.

Figure 1B:
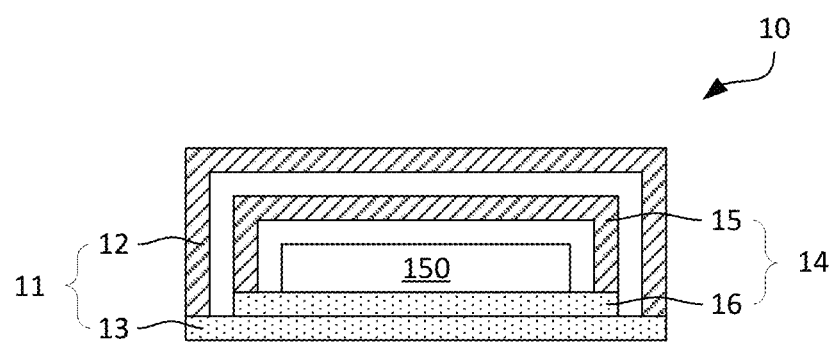
FIG. 1B is a schematic illustration of an EUV reticle pod used in the system of the present disclosure.

The reticle 150 may be disposed in an EUV reticle pod 10 shown in FIG. 1B. For example, the reticle 150 may be disposed an EUV inner pod (EIP) 14. The EIP 14 may include an EIP base 16 and an EIP cover 15. The reticle 150 may be stored face up or face down on the EIP base 16. The EIP cover 15 may be secured to the EIP base 16 to effectively sandwich the reticle 150 between the EIP base 16 and the EIP cover 15. The EIP 14 may be contained in an outer pod, sometimes referred to as a Reticle SMIF Pod (RSP) 11. The RSP 11 may include an RSP base 13 and an RSP cover 12. The RSP cover 12 may be secured to the RSP base 14 to effectively sandwich the EIP 14 between the RSP base 13 and the RSP cover 12.

The movement of the reticle 150 through the pod loading system 101, including the extraction of the reticle 150 from the EIP by separating the EIP base 16 from the EIP cover 15, is described, for example, in U.S. Pat. No. 9,851,643. The entire disclosure of which is hereby incorporated by reference.

Figure 2A:
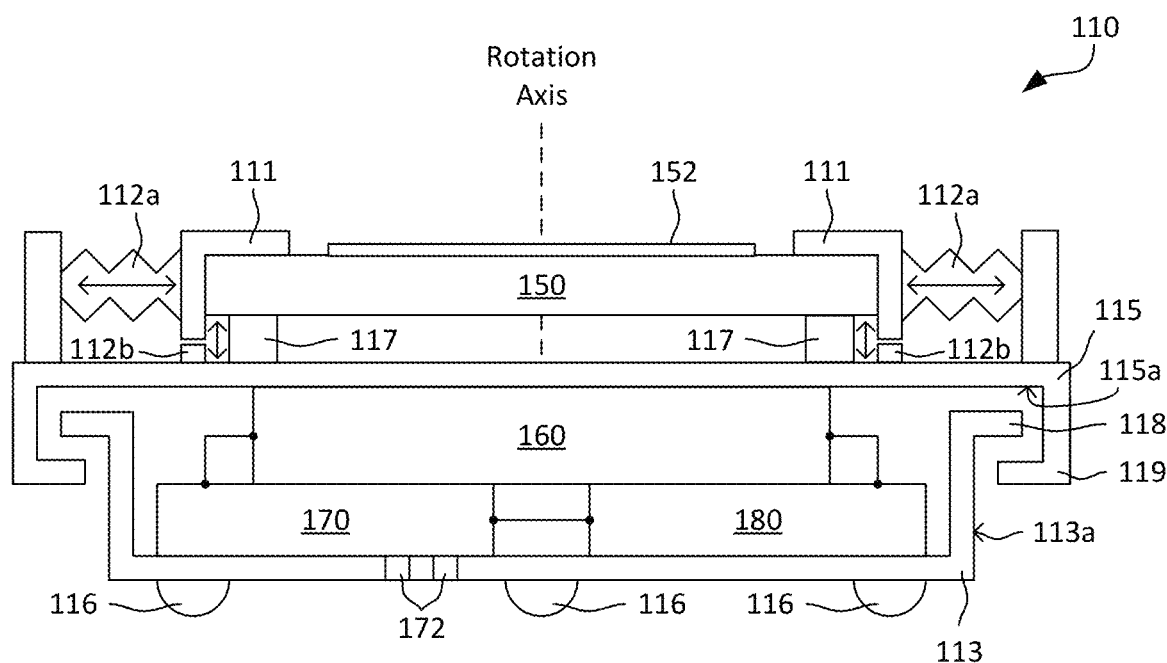
FIG. 2A is a section view of an active reticle carrier according to an embodiment of the present disclosure.
Figure 2B:
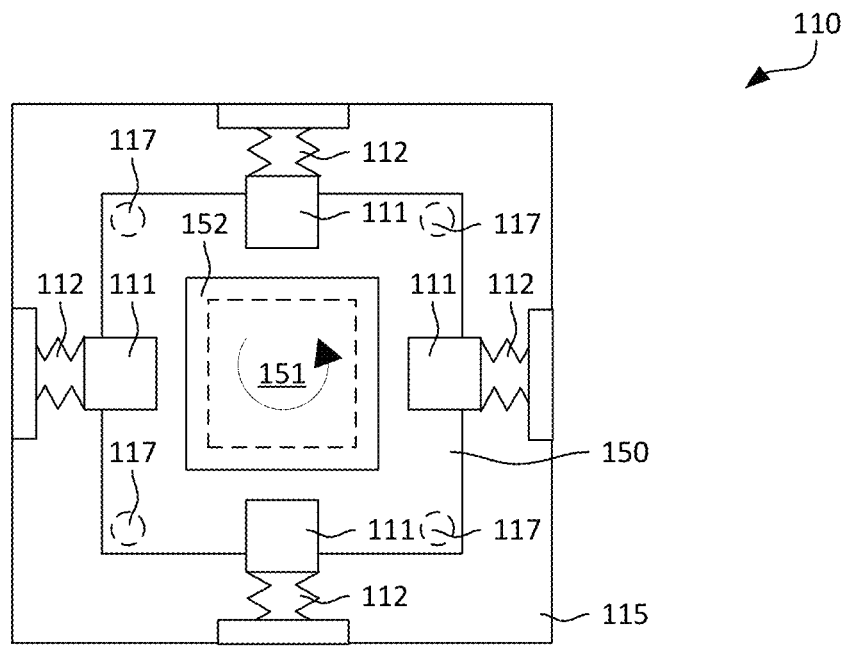
FIG. 2B is a top view of an active reticle carrier according to an embodiment of the present disclosure.
Figure 3:
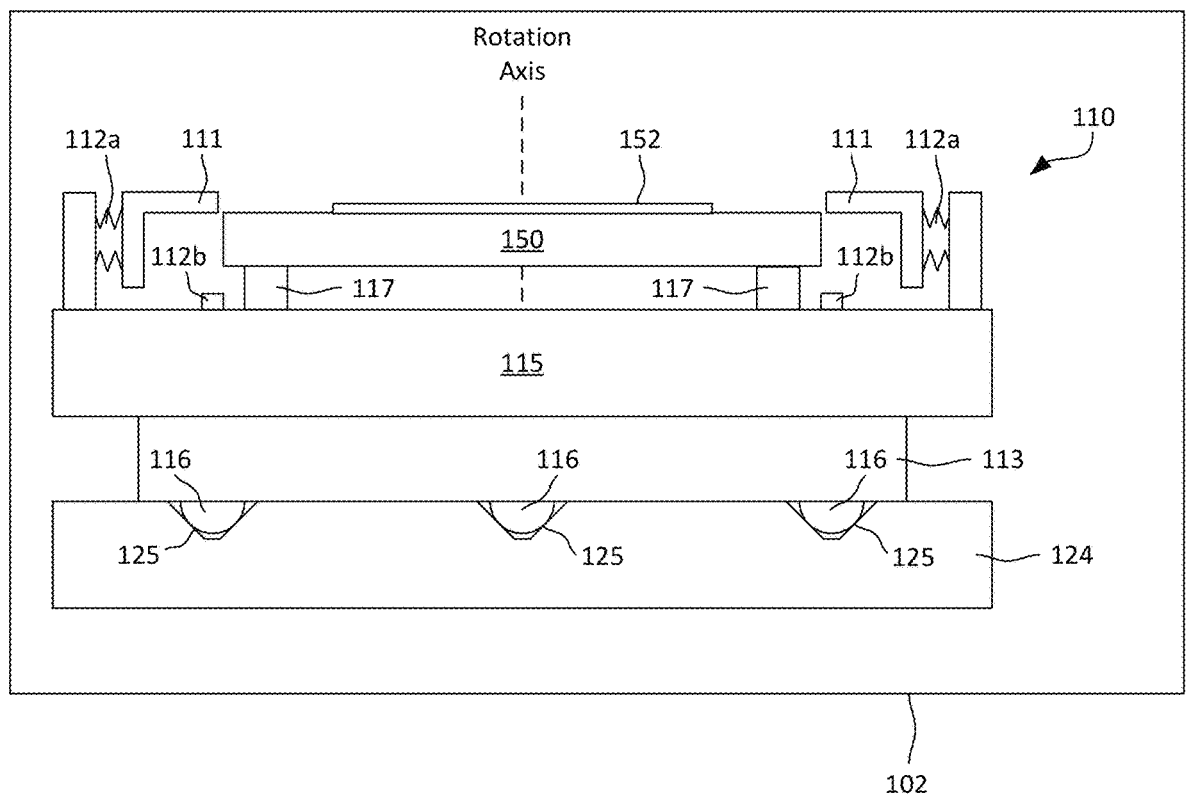
FIG. 3 is a schematic illustration of an active reticle carrier disposed on a loading station in a reticle loading system of the reticle inspection system according to an embodiment of the present disclosure.

Referring to FIGS. 2-5, the system 100 may comprise an active reticle carrier 110. The reticle 150 may be disposed on the active reticle carrier 110 in the reticle loading system 102 of the system 100, as shown in FIG. 3. For example, the active reticle carrier 110 may be disposed on a loading station 124 in the reticle loading system 102. A pellicle 152 may be disposed on the reticle 150. The presence of the pellicle 152 may indicate whether the reticle 150 is face-up or face-down on the active reticle carrier 110.

The reticle 150 may be clamped to the active reticle carrier 110. For example, the active reticle carrier 110 may include reticle clamping elements 111 that are movable relative to the active reticle carrier 110 by actuators 112a, 112b, as shown in FIGS. 2A-2B. The actuators 112a, 112b may be magnetic, or any other suitable actuator capable of moving reticle clamping elements 111. For example, first actuators 112a may move the reticle clamping elements 111 inward and outward relative to the active reticle carrier 110, and second actuators 112b may move the reticle clamping elements 112b may move the reticle clamping elements 111 up and down relative to the active reticle carrier 110. The reticle clamping elements 111 may engage sides of the reticle 150 (as shown in FIG. 2B) or corners of the reticle 150. When the reticle 150 is disposed on the active reticle carrier 110, the actuators 112a, 112b may move the reticle clamping elements 111 from a disengaged position to an engaged position that effectively clamps the reticle 150 to the active reticle carrier 110.

The active reticle carrier 110 may be movable between the reticle loading system 102 and the reticle inspection chamber 105 via the transfer chamber 104. For example, the active reticle carrier 110 may be movable from the loading station 124 in the reticle loading system 102 (shown in FIG. 3), to a transfer stage 120 in the transfer chamber 104 (shown in FIG. 4), to a reticle stage 130 in the reticle inspection chamber 105 (shown in FIG. 5). A manipulator (not shown) may move the active reticle carrier 110 between the reticle loading system 102, transfer chamber 104, and the reticle inspection chamber 105.

The system 100 may further comprise an inspection tool 140. The inspection tool 140 may be an optical system or may use an electron beam or an ion beam. The inspection tool 140 may be configured to inspect the reticle 150 when the active reticle carrier 110 is disposed on a reticle stage 130. For example, the inspection tool 140 may be configured to determine an orientation of the reticle 150. According to embodiments of the present disclosure, the reticle 150 may include markings that, when inspected by the inspection tool 140, may be used to determine the orientation of the reticle 150. For example, the markings may be RPAS marks, SEMI P48 markings, or other markings known in the art used to determine the orientation of the reticle 150.

The active reticle carrier 110 may be configured to rotate the reticle 150. In particular, the active carrier 110 may be configured to rotate the reticle 150 about a rotation axis. The rotation axis may be centrally located relative to the active reticle carrier 110. The active reticle carrier may be configured to rotate the reticle 150 while the active carrier 110 is disposed on the reticle stage 130. In this way, the active reticle carrier 110 may reorient the reticle 150 while the active carrier 110 is disposed on the reticle stage 130 in the reticle inspection chamber 105. A passive reticle carrier used in the related art removes the reticle 150 from the reticle inspection chamber 105 and off of the reticle stage 130 in order to perform realignment. However, with the inspection system 100 of the present disclosure, the active reticle carrier 110 may reorient the reticle 150 in situ, while the active reticle carrier 110 is disposed on the reticle stage 130 in the reticle inspection chamber 105. In some embodiments, the active reticle carrier 110 may also reorient the reticle 150 while the active reticle carrier is disposed on the transfer stage 120, or at any other part of the movement of the reticle 150 through the reticle inspection system 100.

As shown in FIG. 2A, the active reticle carrier 110 may comprise a carrier base 113 and a rotation plate 115. As shown in FIG. 2B, the carrier base 113 and the rotation plate 115 may have an annular shape. For example, aperture 151 may be defined by the annular shape of the carrier base 113 and the rotation plate 115. The rotation plate 115 may be rotatably mounted to the carrier base 113. The reticle 150 may be disposed on the rotation plate 115. Thus, by rotating the rotation plate 115 relative to the carrier base 113, the orientation of the reticle 150 may be adjusted.

A piezoelectric motor 160 may be disposed in the carrier base 113. The piezoelectric motor 160 may be configured to rotate the rotation plate 115 relative to the carrier base 113. The piezoelectric motor 160 may also have an annular shape. The piezoelectric motor 160 may be a piezo-motor-based stage with an accurate positioning system for high repeatability and high angle sensitivity. For example, the piezoelectric motor 160 may have a rotation angle sensitivity of 5 micro radians, and a 180 degree range.

Figure 4:
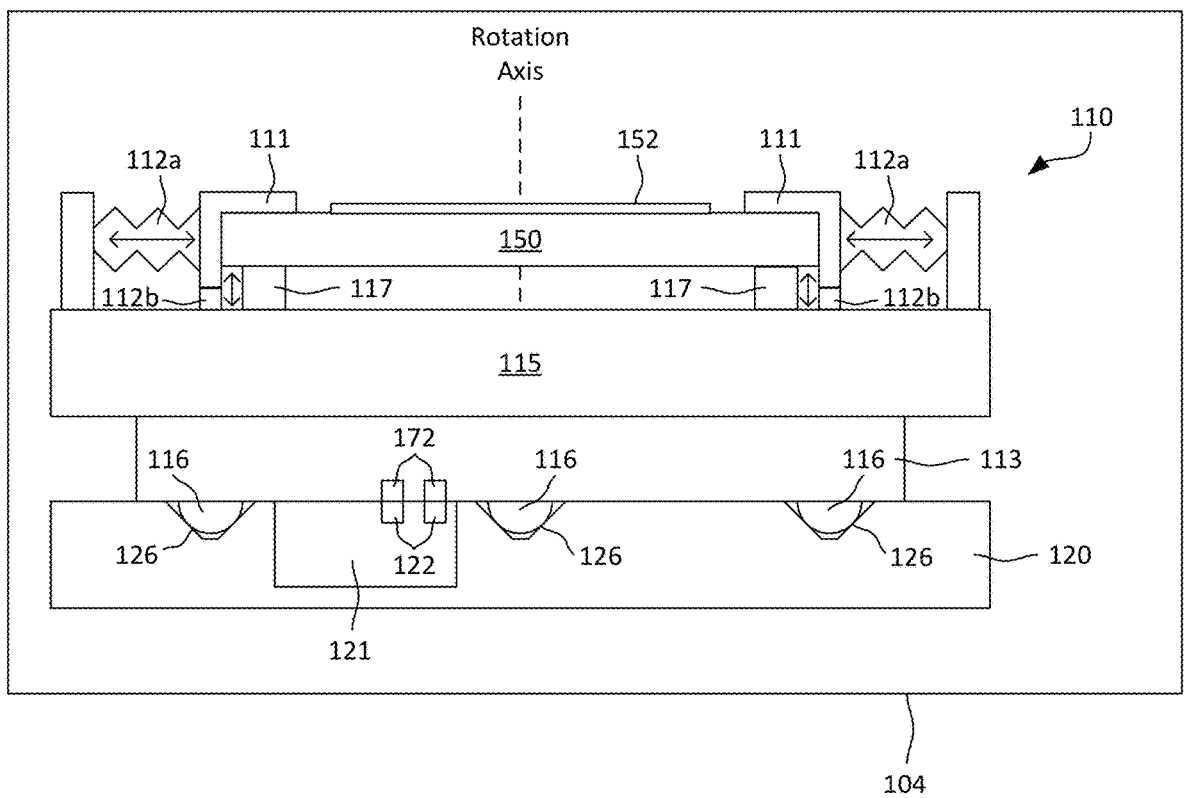
FIG. 4 is a schematic illustration of an active reticle carrier disposed on a transfer stage in a transfer chamber of the reticle inspection system according to an embodiment of the present disclosure.
Figure 5:
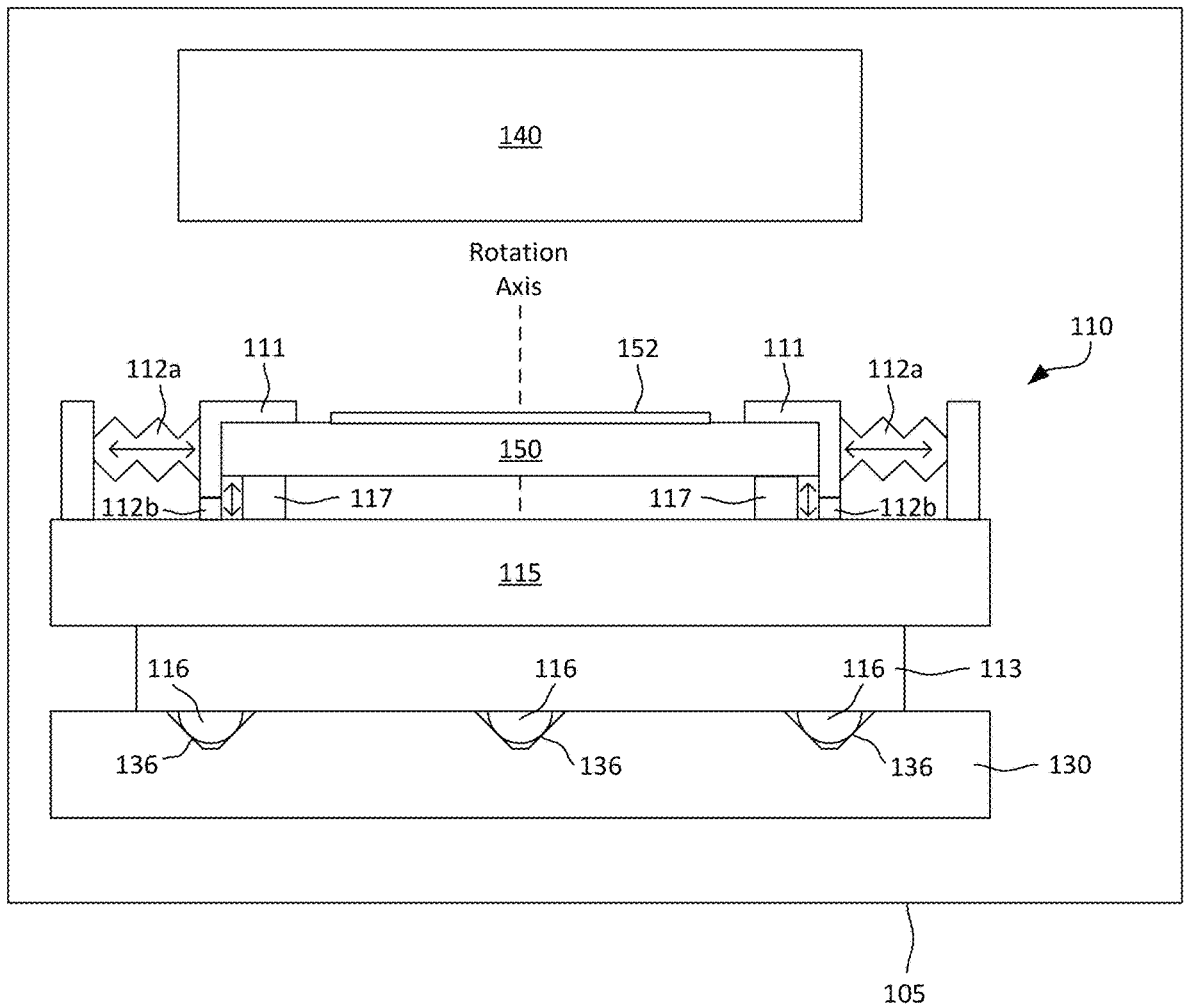
FIG. 5 is a schematic illustration of an active reticle carrier disposed on a reticle stage in a reticle inspection chamber of the reticle inspection system according to an embodiment of the present disclosure.

A battery 170 may be disposed in the carrier base 113. The battery 170 may be configured to power the piezoelectric motor 160. The battery 170 may be a rechargeable battery. For example, the battery 170 may be a wirelessly-rechargeable battery. The transfer stage 120 may be configured to recharge the battery 170 when the active reticle carrier 110 is disposed on the transfer stage 120, or at any other part of the system 100. For example, a charger 121 may be disposed in the transfer stage 120, as shown in FIG. 4. The charger 141 may wirelessly recharge the battery 170 via induction, or it may directly recharge the battery 170 via charging contacts 122 on the transfer stage 120 being in contact with battery contacts 172. With the active reticle carrier 110 of the present disclosure, replacement of the battery 170 may not be needed, as the charger 121 may recharge the battery 170. It can be appreciated that replacing the battery 170 may increase downtime of the system 100 and may risk contamination of the system 100 while extracting the active reticle carrier 110 to replace the battery 170. Accordingly, the active reticle carrier 110 may avoid these issues.

A processor 180 may be disposed in the carrier base 113. The processor 180 may include a microprocessor, a microcontroller, or other devices.

The processor 180 may be coupled to the components of the system 100 in any suitable manner (e.g., via one or more transmission media, which may include wired and/or wireless transmission media) such that the processor 180 can receive output. The processor 180 may be configured to perform a number of functions using the output. The inspection tool can receive instructions or other information from the processor 180. The processor 180 optionally may be in electronic communication with another inspection tool, a metrology tool, or a review tool (not illustrated) to receive additional information or send instructions.

The processor 180 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 180 may be disposed in or otherwise part of the system 100 or another device. In an example, the processor 180 and may be part of a standalone control unit or in a centralized quality control unit. Multiple processors 180 may be used, defining multiple subsystems of the system 100.

The processor 180 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 180 to implement various methods and functions may be stored in readable storage media, such as a memory.

If the system 100 includes more than one subsystem, then the different processors 180 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 180 may be configured to perform a number of functions using the output of the components of the system 100 or other output. For instance, the processor 180 may be configured to send the output to an electronic data storage unit or another storage medium. The processor 180 may be further configured as described herein.

The processor 180 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 180 may be configured according to any of the embodiments described herein. The processor 180 also may be configured to perform other functions or additional steps using the output of the system 100 or using images or data from other sources.

The processor 180 may be communicatively coupled to any of the various components or sub-systems of system 100 in any manner known in the art. Moreover, the processor 180 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 180 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 180 (or computer subsystem) or, alternatively, multiple processors 180 (or multiple computer subsystems). Moreover, different sub-systems of the system 100 may include one or more computing or logic systems. Therefore, the above description should not be interpreted as a limitation on the present disclosure but merely an illustration According to embodiments of the present disclosure, the processor 180 may draw power from the battery 170. The processor 180 may be in electronic communication with the inspection tool 140. For example, the processor 180 may be in wireless communication with the inspection tool 140 or in wired communication with the inspection tool 140. The processor 180 may be configured to receive orientation information corresponding to the orientation of the reticle 150 from the inspection tool 140. The processor 180 may be configured to instruct the piezoelectric motor 160 to rotate the rotation plate 115 based on the orientation information received from the inspection tool 140. In this way, system 100 may be a closed loop system in which the orientation of the reticle 150 may be determined by the inspection tool 140 and the active reticle carrier 110 may reorient the reticle 150 in situ, while the active reticle carrier 110 is disposed on the reticle stage 130 in the reticle inspection chamber 105.

According to an embodiment of the present disclosure, the second actuators 112b may be disposed on the active reticle carrier 110. For example, the second actuators 112b may be disposed on the rotation plate 115. The second actuators 112b may be electromagnetic actuators, and may be in electronic communication with the processor 180. For example, the processor 180 may apply a known voltage to the second actuators 112b to apply an electromagnetic force. The electromagnetic force may cause the reticle clamping elements 111 to move up or down to effectively clamp the reticle 150 to the active reticle carrier 110. For example, when the reticle clamping elements 111 move from the disengaged position (shown in FIG. 3) to the engaged position (e.g., shown in FIG. 4), they effectively clamp the reticle 150 to the active reticle carrier 110. It can be appreciated that excessive clamping force may damage the reticle 150 or impact the orientation of the reticle 150 and reduce accuracy of the scan. Therefore, by applying a known voltage to the second actuators 112b, the clamping force on the reticle 150 can be controlled by the processor 180, and the processor 180 can transmit the clamping force to the inspection tool 140 for closed-loop control.

The active reticle carrier 110 may further comprise kinematic couplings 116 protruding from a lower surface of the carrier base 113. The kinematic couplings 116 may engage with corresponding indentations 125 in the loading station 124 when the active reticle carrier 110 is disposed on the loading station 124. The kinematic couplings 116 may also engage with corresponding indentations 126 in the transfer stage 120 when the active reticle carrier 110 is disposed on the transfer stage 120. The kinematic couplings 116 may also engage with corresponding indentations 136 in the reticle stage 130 when the active reticle carrier 110 is disposed on the reticle stage 130.

The active reticle carrier 110 may further comprise at least two reticle posts 117 protruding upwardly from the rotation plate 114. For example, the at least two reticle posts 117 may be arcuate, circular, or polygonal structures protruding upwardly from the rotation plate 115. The reticle 150 may be disposed on the at least two reticle posts 117 such that the reticle 150 is spaced apart from the rotation plate 115. For example, the reticle 150 may be spaced apart from the rotation plate 115 by a distance of about 500 µm.

According to an embodiment of the present disclosure shown in FIG. 2A, the carrier base 113 may comprise a first flange 118. The first flange may extend outwardly from a side wall 113a of the carrier base 113. The rotation plate 115 may comprise a second flange 119. The second flange 119 may extend downward and inward from a bottom surface 115a of the rotation plate 115. Accordingly, the rotation plate 115 may be rotatably mounted to the carrier base 113 such that the first flange 118 is positioned between the second flange 119 and the bottom surface 115a of the rotation plate 115. There may be gaps between first flange 118 and the second flange 119 and between the second flange 119 and the bottom surface 115a of the rotation plate 115. It can be appreciated that the arrangement of the first flange 118 and the second flange 119 may allow the rotation plate 115 to rotate relative to the carrier base 113, and may prevent particles from exiting the carrier base 113 and contaminating the reticle inspection chamber 105.

With the system 100 of the present disclosure, the reticle inspection process may be improved compared to the related art. For example, the active reticle carrier 110 can reorient the reticle 150 while the active reticle carrier 110 is disposed on the reticle stage 130, while previous systems require the reticle to be unloaded to perform realignment. Thus, the system 100 can increase throughput compared to prior art systems. In addition, the reticle 150 does not need to be unclamped and re-clamped during reorientation, so the probability of particulate disturbance is reduced. Furthermore, the active reticle carrier 110 can communicate directly with the inspection tool 140 to provide a clamping force on the reticle 150 and may rotate the reticle 150 based on orientation information received from the inspection tool 140. In this way, the system 100 may be a closed loop system with high accuracy alignment and scanning.

Figure 6:
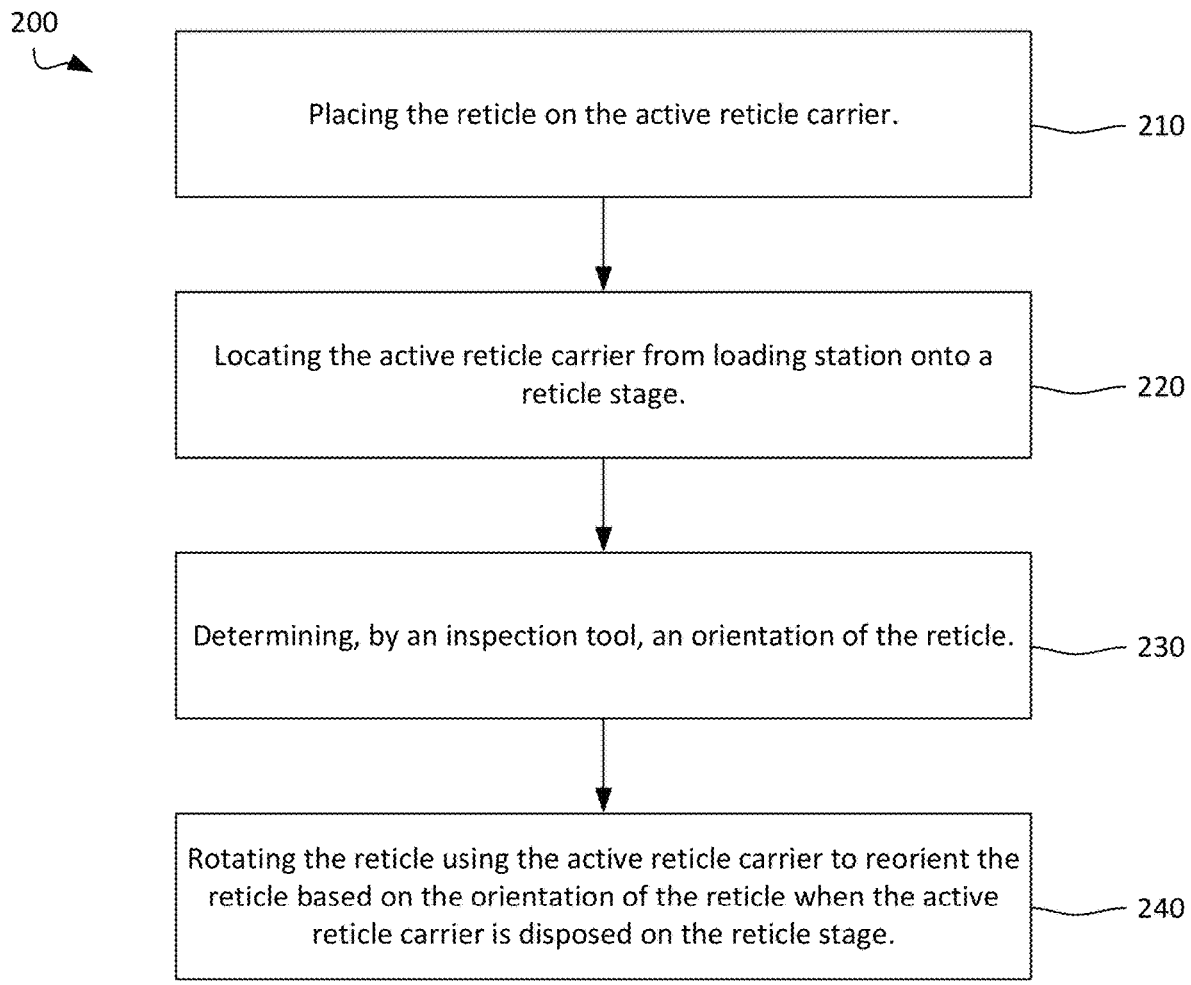
FIG. 6 is a flowchart of a method of handling a reticle in a reticle inspection system according to an embodiment of the present disclosure.

An embodiment of the present disclosure provides a method 200 of handling a reticle in a reticle inspection system. The method may be applied to the reticle inspection system 100. As shown in FIG. 6, the method 200 may comprise the following steps.

At step 210, the reticle may be placed on an active reticle carrier. The active reticle carrier may be disposed on a loading station in a reticle loading system of the reticle inspection system, such as those disclosed herein. The active reticle carrier may comprise a carrier base and a rotation plate. The carrier base and the rotation plate may have an annular shape. The rotation plate may be rotatably mounted to the carrier base. The reticle may be disposed on the rotation plate. Thus, by rotating the rotation plate relative to the carrier base, the orientation of the reticle may be adjusted.

The active reticle carrier may further comprise at least two reticle posts protruding upwardly from the rotation plate. For example, the at least two reticle posts may be arcuate, circular, or polygonal structures protruding upwardly from the rotation plate. The reticle may be disposed on the at least two reticle posts such that the reticle is spaced apart from the rotation plate. For example, the reticle may be spaced apart from the rotation plate by a distance of about 500 µm.

A piezoelectric motor may be disposed in the carrier base. The piezoelectric motor may be configured to rotate the rotation plate relative to the carrier base. The piezoelectric motor may also have an annular shape. The piezoelectric motor may be a piezo-motor-based stage with an accurate positioning system for high repeatability and high angle sensitivity. For example, the piezoelectric motor may have a rotation angle sensitivity of 5 micro radians, and a 180 degree range.

A battery may be disposed in the carrier base. The battery may be configured to power the piezoelectric motor. The battery may be a rechargeable battery. For example, the battery may be a wirelessly-rechargeable battery. The transfer stage may be configured to recharge the battery when the active reticle carrier is disposed on the transfer stage. For example, a charger may be disposed in the transfer stage. The charger may wirelessly recharge the battery via induction, or it may directly recharge the battery via charging contacts on the transfer stage being in contact with battery contacts.

According to an embodiment of the present disclosure, the carrier base may comprise a first flange. The first flange may extend outwardly from a side wall of the carrier base. The rotation plate may comprise a second flange. The second flange may extend downward and inward from a bottom surface of the rotation plate. Accordingly, the rotation plate may be rotatably mounted to the carrier base such that the first flange is positioned between the second flange and the bottom surface of the rotation plate. There may be gaps between first flange and the second flange and between the second flange and the bottom surface of the rotation plate. It can be appreciated that the arrangement of the first flange and the second flange may allow the rotation plate to rotate relative to the carrier base, and may prevent particles from exiting the carrier base and contaminating the reticle inspection chamber.

At step 220, the active reticle carrier may be located from the loading station onto a reticle stage. The reticle stage may be disposed in a reticle inspection chamber of the reticle inspection system. The active reticle carrier may further comprise kinematic couplings protruding from a lower surface of the carrier base. The kinematic couplings may engage with corresponding indentations in the reticle stage when the active reticle carrier is disposed on the reticle stage.

At step 230, an inspection tool may determine an orientation of the reticle. The inspection tool may be an optical system or may use an electron beam or an ion beam. The inspection tool may be configured to inspect the reticle when the active reticle carrier is disposed on a reticle stage. According to embodiments of the present disclosure, the reticle may include markings that, when inspected by the inspection tool, may be used to determine the orientation of the reticle. For example, the markings may be RPAS marks, SEMI P48 markings, or other markings known in the art used to determine the orientation of the reticle.

A processor may be disposed in the carrier base. The processor may draw power from the battery. The processor may be in electronic communication with the inspection tool. For example, the processor may be in wireless communication with the inspection tool or in wired communication with the inspection tool. The processor may be configured to receive orientation information corresponding to the orientation of the reticle from the inspection tool.

At step 240, the reticle may be rotated using the active reticle carrier to reorient the reticle based on the orientation of the reticle while the active reticle carrier is disposed on the reticle stage. The active reticle carrier may reorient the reticle while the active carrier is disposed on the reticle stage in the reticle inspection chamber. For example, the processor may be configured to instruct the piezoelectric motor to rotate the rotation plate based on the orientation information received from the inspection tool. It can be appreciated that a passive reticle carrier used in the related art would require removing the reticle from the reticle inspection chamber and off of the reticle stage in order to perform realignment. However, with the method 200 of the present disclosure, the active reticle carrier may reorient the reticle in situ, while the active reticle carrier is disposed on the reticle stage in the reticle inspection chamber.

According to an embodiment of the present disclosure, the reticle may be disposed in an EUV reticle pod. For example, the reticle may be disposed in an EUV inner pod (EIP). Before placing the reticle on the active reticle carrier at step 210, the method 200 may further comprise opening the EIP by separating an EIP base from an EIP cover of the EIP. Particular details regarding the extraction of the reticle from the EUV reticle pod are described, for example, in U.S. Pat. No. 9,851,643.

Figure 7:
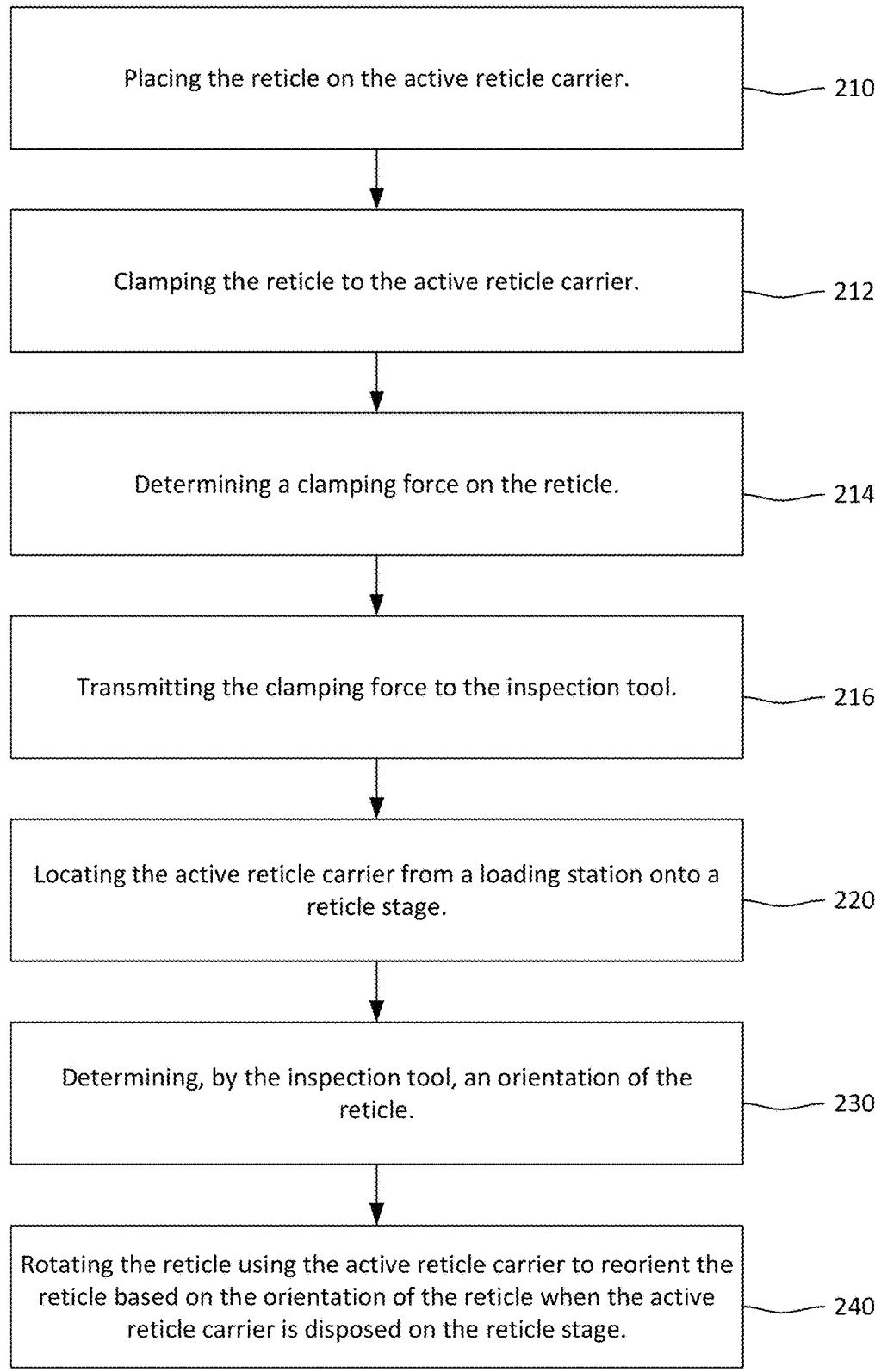
FIG. 7 is a flow chart of a method of handling a reticle in a reticle inspection system according to another embodiment of the present disclosure.

According to an embodiment of the present disclosure, before locating the active reticle carrier from the transfer stage to the reticle stage at step 220, the method 200 may further comprise the following steps, as shown in FIG. 7.

At step 212, the reticle may be clamped to the active reticle carrier. For example, the active reticle carrier may include reticle clamping elements that are movable relative to the active reticle carrier by actuators. The actuators may be magnetic, or any other suitable actuator capable of moving reticle clamping elements. For example, first actuators may move the reticle clamping elements inward and outward relative to the active reticle carrier, and second actuators may move the reticle clamping elements may move the reticle clamping elements up and down relative to the active reticle carrier. The reticle clamping elements may engage sides of the reticle or corners of the reticle. When the reticle is disposed on the active reticle carrier, the actuators may move the reticle clamping elements from a disengaged position to an engaged position that effectively clamps the reticle to the active reticle carrier.

At step 214, a clamping force applied by the second actuators to the reticle may be determined. The second actuators may be disposed on the rotation plate. The second actuators may be electromagnetic actuators, and may be in electronic communication with the processor. For example, the processor may apply a known voltage to the second actuators to apply an electromagnetic force. The electromagnetic force may cause the reticle clamping elements to move up or down to apply the clamping force and effectively clamp the reticle to the active reticle carrier. For example, when the reticle clamping elements move from the disengaged position to the engaged position, they effectively clamp the reticle to the active reticle carrier. It can be appreciated that excessive clamping force may damage the reticle or impact the orientation of the reticle and reduce accuracy of the scan. Therefore, by applying a known voltage to the second actuators, the clamping force on the reticle can be controlled by the processor.

At step 216, the clamping force on the reticle may be transmitted to the inspection tool. For example, the processor may transmit the clamping force to the inspection tool. In this way, the clamping force can be monitored to avoid excessive force on the reticle.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A reticle inspection system comprising:
   an active reticle carrier, wherein a reticle is disposed on the active reticle carrier, wherein the active reticle carrier includes:
   a carrier base;
   a rotation plate rotatably mounted to the carrier base; and
   a piezoelectric motor disposed in the carrier base and configured to rotate the rotation plate relative to the carrier base; and
   an inspection tool configured to determine an orientation of the reticle when the active reticle carrier is disposed on a reticle stage;
   wherein the active reticle carrier is movable between a loading station and the reticle stage and is configured to rotate the reticle to reorient the reticle based on the orientation of the reticle while the active carrier is disposed on the reticle stage.

2. The system of claim 1, wherein the reticle is clamped to the active reticle carrier.

3. The system of claim 2, further comprising an electromagnetic actuator disposed on the active reticle carrier configured to apply a clamping force on the reticle.

4. The system of claim 1, wherein the active reticle carrier further comprises a rechargeable battery disposed on the carrier base and configured to power the piezoelectric motor, wherein a transfer stage configured to recharge the rechargeable battery when the active reticle carrier is disposed on the transfer stage.

5. The system of claim 1, wherein the active reticle carrier further comprises:
   a processor disposed in the carrier base and in electronic communication with the inspection tool, wherein the processor is configured to receive orientation information corresponding to the orientation of the reticle and cause the rotation plate to rotate based on the orientation information.

6. The system of claim 1, wherein the active reticle carrier further comprises kinematic couplings protruding from a lower surface of the carrier base which engage with corresponding indentations in the reticle stage when the carrier base is disposed on the reticle stage.

7. The system of claim 1, wherein the active reticle carrier further comprises at least two reticle posts protruding upwardly from the rotation plate, wherein the reticle is disposed on the at least two reticle posts such that the reticle is spaced apart from the rotation plate.

8. The system of claim 1, wherein the carrier base comprises a first flange extending outwardly from a side wall of the carrier base;
   wherein the rotation plate comprises a second flange extending downward and inward from a bottom surface of the rotation plate; and wherein the rotation plate is rotatably mounted to the carrier base such that the first flange is positioned between the second flange and the bottom surface of the rotation plate.

9. The system of claim 1, wherein the reticle is disposed in an EUV inner pod (EIP) which is opened by separating an EIP base from an EIP cover of the EIP before the reticle is placed on the active reticle carrier.

10. A method of handling a reticle in a reticle inspection system comprising:
    placing the reticle on an active reticle carrier disposed on a loading station, wherein the active reticle carrier includes:
      a carrier base;
      a rotation plate rotatably mounted to the carrier base; and
      a piezoelectric motor disposed in the carrier base and configured to rotate the rotation plate relative to the carrier base;
    locating the active reticle carrier from the loading station onto a reticle stage;
    determining, by an inspection tool, an orientation of the reticle;
    rotating the reticle using the active reticle carrier to reorient the reticle based on the orientation of the reticle while the active reticle carrier is disposed on the reticle stage.

11. The method of claim 10, before locating the active reticle carrier from the loading station to the reticle stage, the method further comprises:
    clamping the reticle to the active reticle carrier.

12. The method of claim 11, further comprising:
    determining a clamping force applied by an electromagnetic actuator on the reticle, wherein the electromagnetic actuator is disposed on the active reticle carrier; and
    transmitting the clamping force on the reticle to the inspection tool.

13. The method of claim 10, wherein the active reticle carrier further comprises:
    a rechargeable battery disposed on the carrier base and configured to power the piezoelectric motor;
    wherein a transfer stage is configured to charge the rechargeable battery when the active reticle carrier is disposed on the transfer stage.

14. The method of claim 10, wherein the active reticle carrier further comprises:
    a processor disposed in the carrier base and in electronic communication with the inspection tool, wherein the processor is configured to receive orientation information corresponding to the orientation of the reticle and to cause the rotation plate to rotate based on the orientation information using the piezoelectric motor.

15. The method of claim 10, wherein locating the active reticle carrier from the loading station onto the reticle stage comprises:
    disposing the carrier base onto the reticle stage, such that kinematic couplings protruding from a lower surface of the carrier base engage with corresponding indentations on the reticle stage.

16. The method of claim 10, wherein the active reticle carrier further comprises at least two reticle posts protruding upwardly from the rotation plate, wherein the reticle is disposed on the at least two reticle posts such that the reticle is spaced apart from the rotation plate.

17. The method of claim 10, wherein the carrier base comprises a first flange extending outwardly from a side wall of the carrier base;
    wherein the rotation plate comprises a second flange extending downward and inward from a bottom surface of the rotation plate; and
    wherein the rotation plate is rotatably mounted to the carrier base such that the first flange is positioned between the second flange and the bottom surface of the rotation plate.

18. The method of claim 10, wherein the reticle is disposed in an EUV inner pod (EIP), and before placing the reticle on the active reticle carrier, the method further comprises:
    opening the EIP by separating an EIP base from an EIP cover of the EIP.

* * * * *